United States Patent [19]

Abrams et al.

[11] Patent Number: 5,474,177
[45] Date of Patent: Dec. 12, 1995

[54] CONTAINER FOR A WAFER CHIP

[75] Inventors: Robert S. Abrams, Albany, N.Y.;
Ronald P. Supranowicz, Lenox, Mass.

[73] Assignee: Capitol Vial, Inc., Fultonville, N.Y.

[21] Appl. No.: 323,014

[22] Filed: Oct. 14, 1994

[51] Int. Cl.⁶ ................................................. B65D 85/90
[52] U.S. Cl. ........................... 206/710; 206/454; 206/591
[58] Field of Search ........................... 206/328, 332, 206/334, 449, 451, 454, 586, 591

[56] References Cited

U.S. PATENT DOCUMENTS

| | | | |
|---|---|---|---|
| 3,469,686 | 9/1969 | Gutsche et al. | 206/332 |
| 3,482,682 | 12/1969 | Cronkhite | 206/332 |
| 3,552,548 | 1/1971 | Wallestad et al. | 206/328 |
| 3,672,495 | 6/1972 | Bauer et al. | 206/328 |
| 4,767,005 | 8/1988 | Onuma et al. | 206/334 |
| 4,776,462 | 10/1988 | Kosugi et al. | 206/334 |
| 4,783,056 | 11/1988 | Abrams . | |
| 4,812,116 | 3/1989 | Abrams . | |
| 4,815,601 | 3/1989 | Peterson et al. . | |
| 4,842,136 | 6/1989 | Nakasato et al. | 206/334 |
| 4,886,162 | 12/1989 | Ambrogio | 206/334 |
| 4,930,634 | 5/1990 | Williams et al. . | |
| 5,046,615 | 9/1991 | Nentl et al. . | |
| 5,133,470 | 7/1992 | Abrams . | |
| 5,184,723 | 2/1993 | Karl et al. . | |
| 5,199,635 | 4/1993 | Abrams et al. . | |
| 5,353,934 | 10/1994 | Yamauchi et al. | 206/586 |

Primary Examiner—Jimmy G. Foster
Attorney, Agent, or Firm—Novak Druce Herrmann Burt

[57] ABSTRACT

A container for a silicon wafer chip includes a body having a bed for the chip, a plurality of posts defining a lateral perimeter for the chip, and a cap having fingers for maintaining the vertical position of the chip in the container. The bed is sloped from the outer wall to an inner line so that an edge of the chip only is supported on a shoulder. The container includes a sealing arrangement to keep moisture and particle contaminants from the interior.

18 Claims, 4 Drawing Sheets

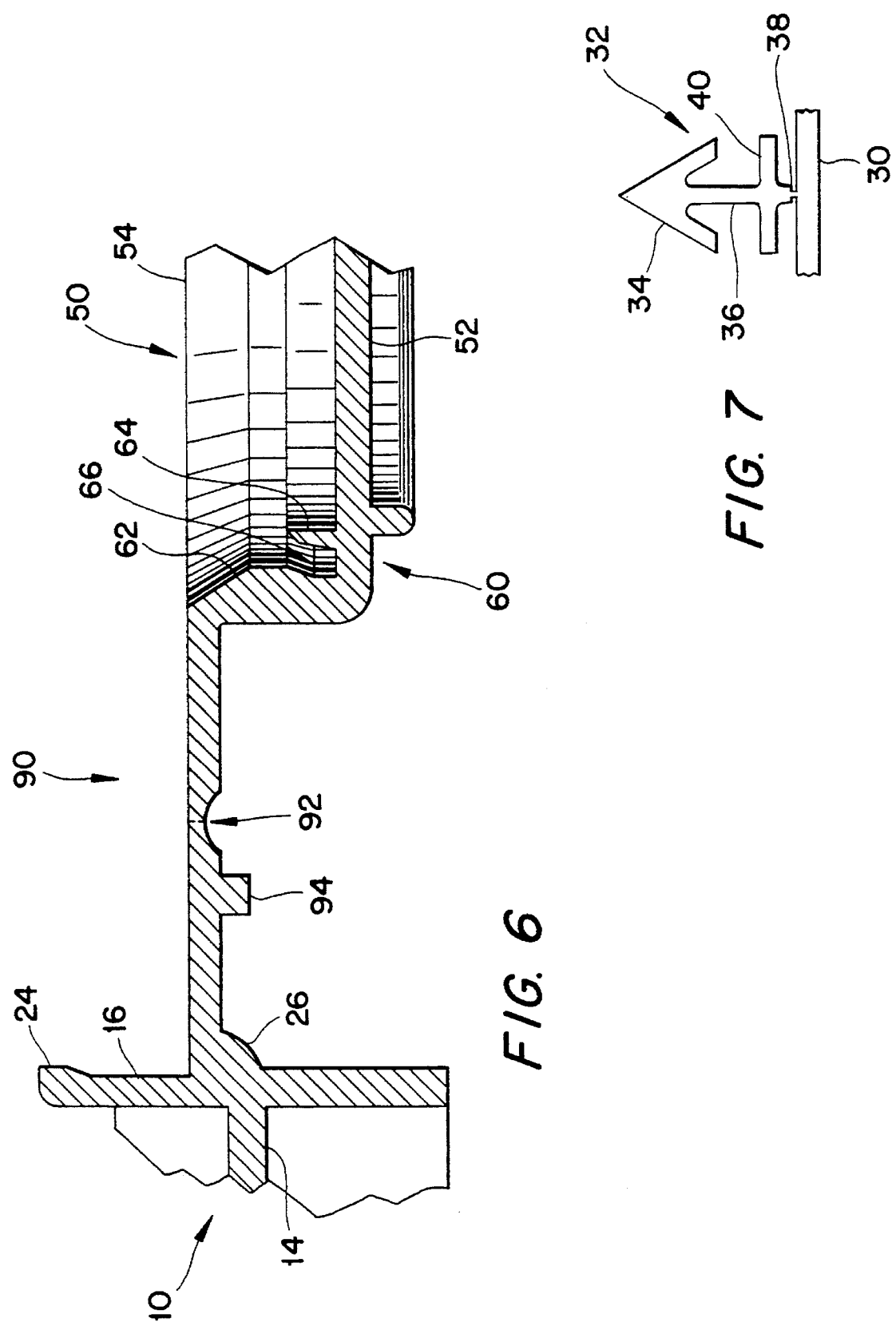

CONTAINER FOR A WAFER CHIP

FIELD OF THE INVENTION

The present invention relates to a container for storing and transporting a silicon chip.

BACKGROUND AND SUMMARY OF THE INVENTION

Silicon wafer chips are brittle and easily damaged in handling. In addition, chips are also easily contaminated by dust or dirt particles and moisture.

The present invention, generally, provides a protective container for silicon wafers that supports the wafers with minimal contact and protects the wafers from contaminants.

More particularly, the present invention provides a container that supports at least one wafer in a horizontal orientation by edge portions of the wafer. The container of the present invention also provides lateral and vertical constraints to prevent movement of the wafer within the container.

The present invention also provides a sealable container to protect at least one silicon wafer in the container from moisture and particle contamination.

According to the present invention, a container comprises a body having a bed and a side wall defining an interior space. A plurality of upright posts are formed in the bed in the interior space and define a perimeter for at least one containing area for a wafer. The posts maintain a lateral position of a wafer chip in the container. The bed of the body is V-shaped within each containing area, so that portions of the bed adjacent and within two opposite sides of the perimeter provide shoulders for supporting an edge portion of a wafer chip.

The cap has a top wall and a side wall. According to an aspect of the invention, a plurality of fingers are formed on the interior side and extend from the top wall of the cap for maintaining a vertical position of a wafer chip in the container. The fingers are preferably formed with a curvature so that in a closed position a relatively broad convex side of each finger contacts a wafer chip in the container and to provide flexibility in a direction perpendicular to the top wall of the cap.

The container according to the present invention provides for a minimal contact at edge portions of the chip. The chip is supported by a portion of the bed adjacent to the upright posts and is constrained from horizontal, or lateral, movement by the upright posts. The fingers in the cap contact the chip near the edges of the chip and constrain the chip from vertical movement.

According to another aspect of the invention, a hinge connects the body with the cap, the hinge being bendable so that the cap is movable from a closed position seated on the body to an open position not seated on the body. The hinge preferably includes a groove extending in a direction transverse to a longitudinal direction of the hinge, the groove providing a weakened zone for concentrating bending of the hinge at a location to reliably and correctly position the cap relative to the body when the cap is moved to the closed position. The hinge preferably also includes a spine adjacent to the groove and extending in a direction transverse to a longitudinal direction of the hinge.

According to yet another aspect of the invention, a pair of recesses are formed in the bed in conjunction with each of the containing areas of the bed to provide access to the edges of the wafer for removing the wafer from the container. Preferably, the recesses are formed at opposite sides of each containing area.

The body further includes a plurality of radially arranged reinforcing ribs formed on an exterior side of the bed of the body to stiffen the bottom to provide protection for the wafer.

A further aspect of the invention includes means for sealing the cap to the body that is air and water tight when the cap is in the closed position. The means for sealing the cap preferably comprises an annular projection formed on an interior side of the top wall and spaced from the side wall to form an annular channel for receiving an end of the body side wall. According to a preferred embodiment, the end of the body side wall is shaped with an outwardly directed rim and the side wall of the cap is shaped with an inwardly directed circumferential ridge spaced from the top wall, the side wall between the ridge and the top wall and the annular projection forming the annular channel.

According to another aspect of the invention, the sealing means further includes a flange extending outwardly from the side wall of the body and a flange extending outwardly from the cap, the body flange and the cap flange contacting when the cap is in the closed position.

According to a further aspect of the invention, the container includes a destructible member integrally attached to one of cap and the body and attachable to the other of the cap and body when the cap is in a closed position, wherein the cap can be opened only upon destruction of the destructible member.

According to yet another aspect of the invention, the side wall of the container extends beyond the bottom of the bed to provide a free edge, and a top, outer surface of the cap is formed with a projection providing a shoulder to receive the edge of another container, so that two or more containers according to the present invention are vertically stackable.

BRIEF DESCRIPTION OF THE DRAWING FIGURES

The present invention can be further understood with reference to the following description in conjunction with the appended drawings, wherein like elements are provided with the same reference numerals. In the drawings:

FIG. 6 is a sectional view of a hinge and sealing means of the container of FIG. 1 taken along the line 6—6;and Fig. 7 is a side view of a breakable member of the means for securing the cap to the body according to the present invention

DETAILED DESCRIPTION OF PREFERRED EMBODIMENTS

Figure 1:
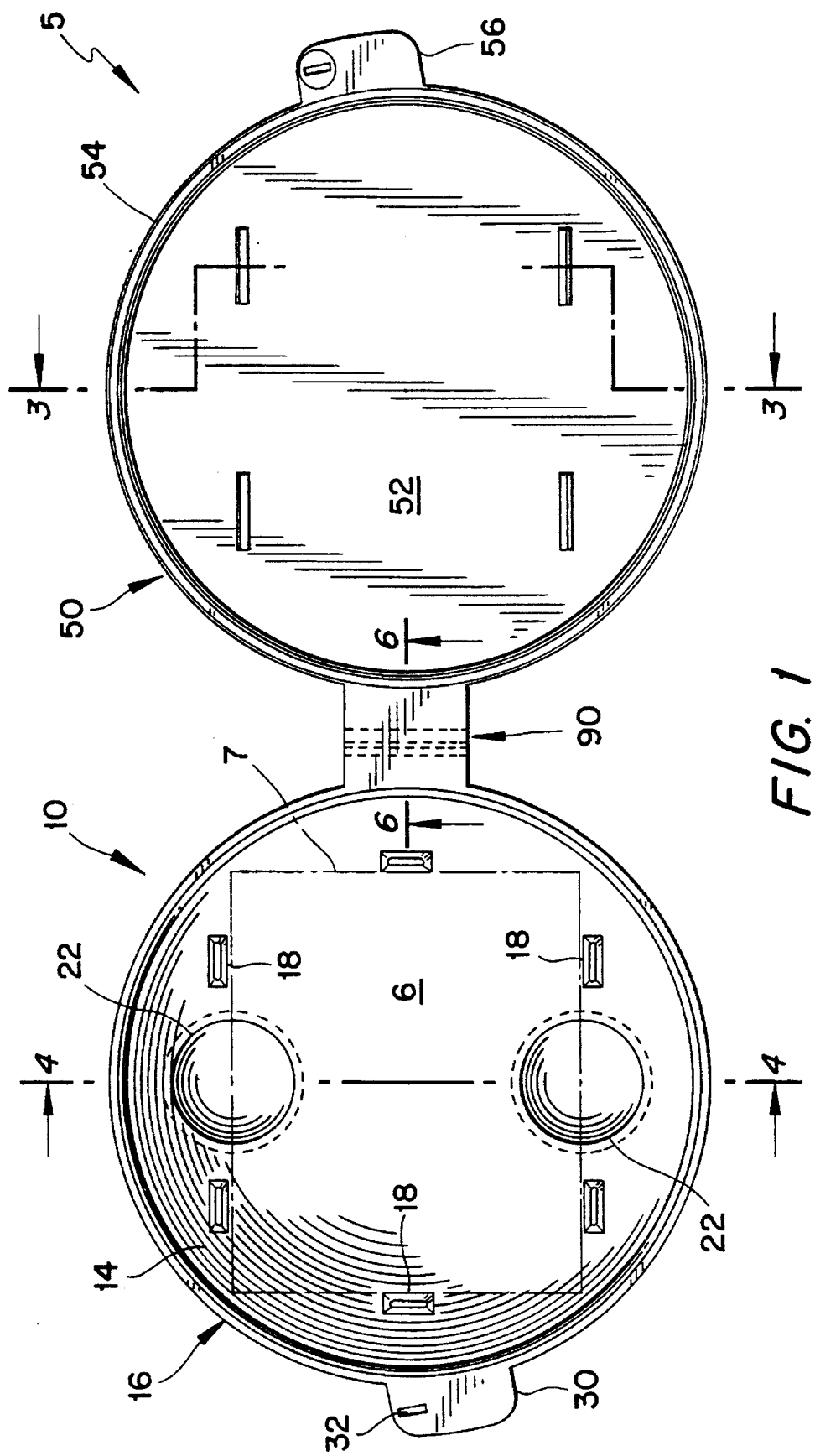
FIG. 1 is a top view of a container in an open position according to the present invention.
Figure 2:
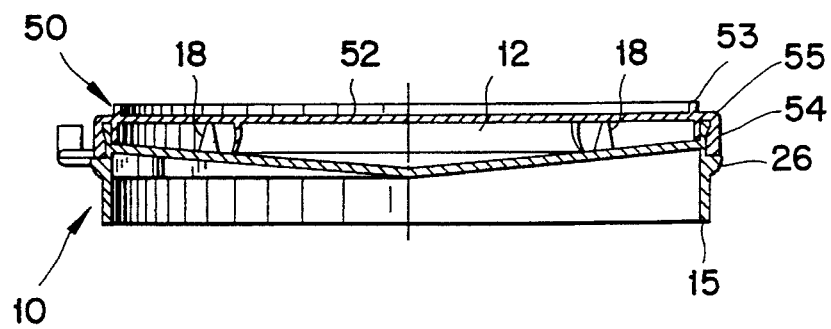
FIG. 2 is a side view of the container of FIG. 1 in a closed position.
Figure 3:
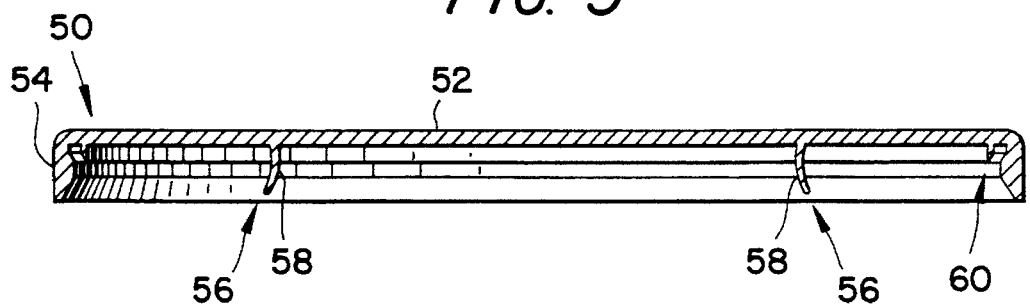
FIG. 3 is a bottom view of the container of FIG. 1.
Figure 4:
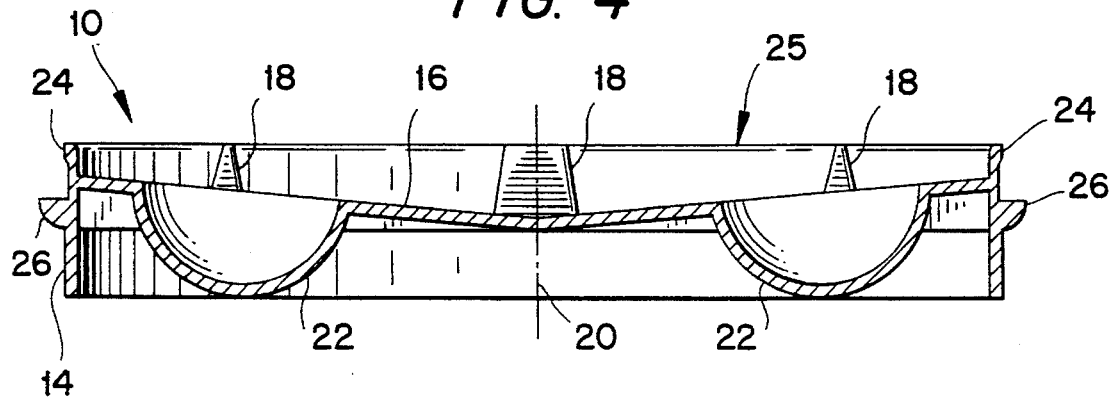
FIG. 4 is a sectional view of a cap of the container of FIG. 1 taken along the line 4—4.

FIG. 1 is a top view of a container 5 in accordance with the invention. The container 5 illustrated is for a single wafer, however, as described below, a container according to the present invention can be formed to contain a plurality of wafers. The container 5 includes a body 10 and a cap 50 joined by a hinge 90. The cap 50 has a closed position seated on the body 10 to define an interior containing space 12, as illustrated in FIG. 2. FIG. 3 is a sectional view of the cap 50 taken along the line 3—3 of FIG. 1. FIG. 4 is a sectional view of the body 10 taken along the line 4—4 of FIG. 1.

The container 5 of the present invention is preferably formed by a molding process and a mold, such as those disclosed, respectively, by U.S. Pat. Nos. 4,783,056 to Abrams and 4,812,116 to Abrams.

According to a preferred embodiment, the body 10 is cylindrically shaped and includes a bed 14 and a side wall 16 that define part of the interior containing space 12. Other shapes for the body and cap are possible, for example, square or rectangular, and are not eliminated by the example shown. A plurality of upright posts 18 are formed in the bed 14 and extend upward into the containing space 12. As seen in FIG. 1, six posts 18 are arranged in a substantially square pattern to define a containing area 6 surrounded by a perimeter 7. The containing area 6 holds a chip on a plane perpendicular to the side wall 16. The arrangement shown is illustrative; the posts 18 can be arranged in any suitable pattern to accommodate the shape of the chip for which the container 5 is intended. In addition, posts may be formed to define more than one containing area so that two or more wafers may be contained on the bed 14 side-by-side on a single plane. The posts 18 prevent lateral movement of a chip relative to the container, and thus help maintain the chip in place in the containing area 6.

As may be seen in FIG. 3, the bed 14 under the chip containing area 6 is sloped from the side wall 16 to the center line 20 of the bed, and assumes a broadened V-shape as shown. A chip resting on the bed 14 is supported only with the portion of the bed adjacent to the posts 18 and on the perimeter 7 of the containing area. In this way, the chip has minimal contact with the bed surface, and the potential for damage to the chip is reduced. For a container for a plurality of chips, the bed 14 may be shaped so that a plurality of V-shaped areas are formed, each corresponding to a chip containing area within a perimeter as described above.

Alternatively, the bed 16 may be shaped to have a low central portion and stepped shoulders to provide the supporting surfaces adjacent to the upright posts. Other configurations are also possible. For example, the posts 18 may be formed with ledges to support the edge of a chip.

Two depressions 22 are formed on opposite sides of the containing area relative to the supporting surface at the perimeter 7 to provide access to edges of a chip for removing the chip from the container. The depressions 22 are illustrated as semi-spherical in shape, however, any conveniently shaped depression or means for providing access to an edge of the chip could be provided. In containers having a plurality of containing areas, depressions are provided on perimeters of each of the containing areas.

The side wall 16 is cylindrically shaped and encloses the at least on containing area 6, including the bed 14, posts 18, and depressions 22. As illustrated in FIG. 3, an upper end of the side wall 16 includes a radially outwardly projecting rim 24. As will be further described below, the rim 24 forms part of sealing means for sealing the cap 50 and the body 10. The upper end of the side wall 16 and the upper end of the posts 18 lie in a common plane 25. The posts 18 provide support for the cap 50 in the closed position on the body 10, as may be seen in FIG. 2.

The side wall 16 includes a flange 26 formed on the exterior of the side wall. As illustrated in FIG. 2, the cap 50 contacts the flange in the closed position to form part of the sealing arrangement further described below.

The cap 50 includes a top wall 52 and a side wall 54. The cap 50 is shaped to cover the body 10 and enclose the body side wall 14, as illustrated in FIG. 2. The cap 50 includes fingers 56 formed on an interior side of the top wall 52 and extending substantially perpendicular to the top wall. The fingers 56 are shaped to have a curvature to provide flexibility. The fingers 56 may also be formed of a flexible material to provide a greater degree of flexibility. When the cap 50 is in the closed position, illustrated in FIG. 2, the fingers 56 extend to the plane of a wafer chip in the container 5. As shown in FIG. 2, the fingers 56 are located to extend adjacent to the upright posts 18 to contact a chip on a top surface near the edges. A chip is held between the fingers 56 and the supporting surface on the bed 16. The fingers 56 help maintain the vertical position of the chip. The fingers 56 are oriented so that a convex side 58 of the fingers faces a central area of the chip and the convex side 58 contacts the chip in the container 5. Of course, a plurality of fingers 56 may be formed in the cap to correspond with each of a plurality of containing areas in a container 5.

The cap 50 includes sealing means 60 for sealing the cap and the body 10, as further described below.

Figure 5:
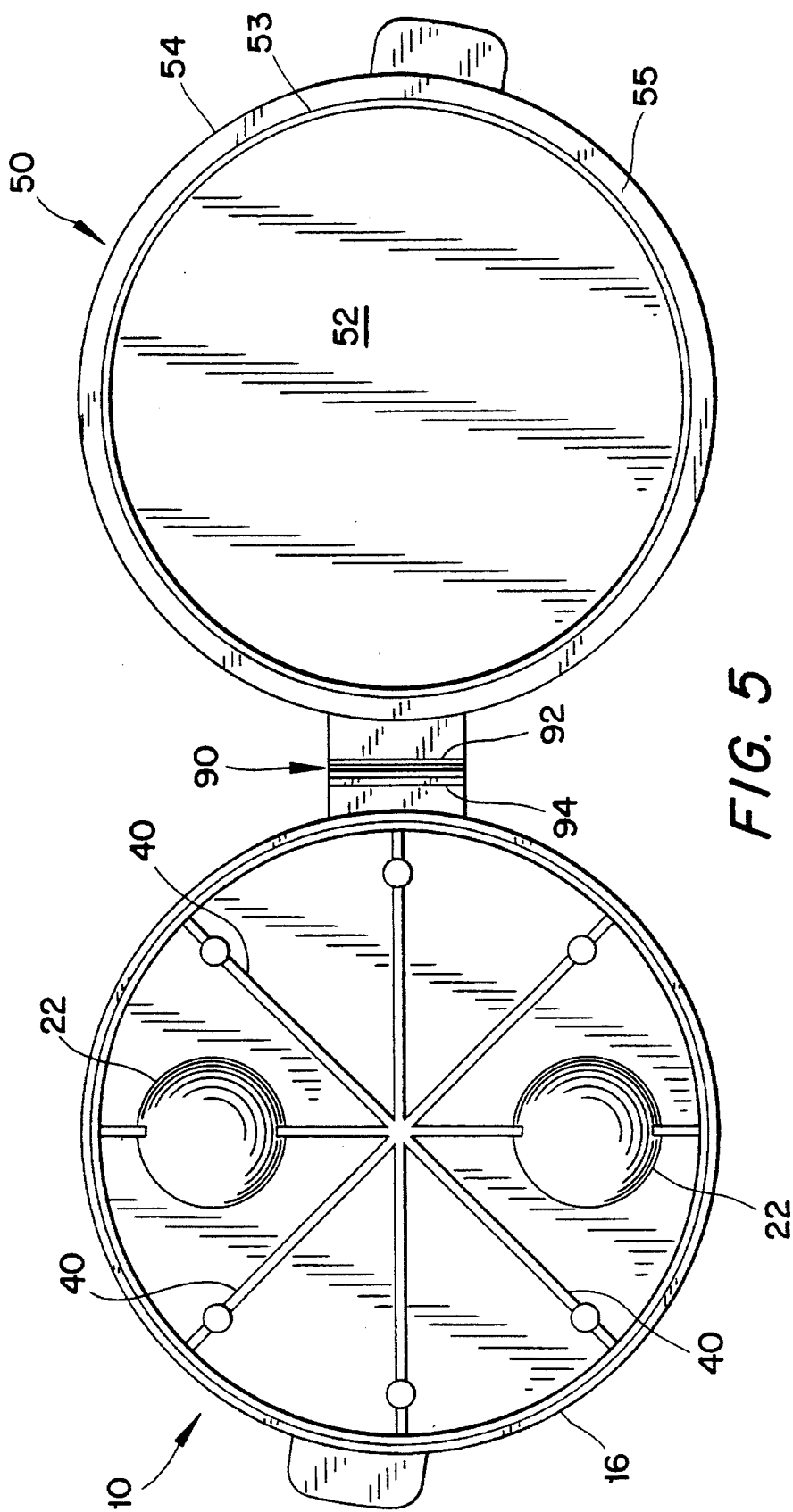
FIG. 5 is a sectional view of a body of the container of FIG. 1 taken along the line 5—5.

FIG. 5 is a bottom view of the container of FIG. 1, which illustrates the exterior sides of the body 10 and the cap 50. The bed 16 is provided with a plurality of ribs 40 on the exterior side of the bed. The ribs 40 provide stiffness for the bed 16 to prevent flexing during handling or storage for protection of the chip.

FIG. 6 is a sectional view of the container of FIG. 1 illustrating details of the sealing means 60 and the hinge 90. The subject matter of U.S. patent application Ser. No. 07/992,780 of Abrams and Supranowicz, filed Dec. 18, 1992, is incorporated herein by reference.

The hinge is a flexible member extending from the flange 26 of the body 10 to the side wall 54 of the cap 50. The hinge 90 is made to bend so that the 10 cap 50 can be seated on the body 10 in a closed position. To ensure that the hinge 90 bends at a desired location to correctly and reliably position the cap on the body, a groove 92 transverse to a longitudinal direction between the body 10 and cap 50 is provided in the hinge at the desired bending location. The groove 92 provides a weakened line in the hinge to concentrate the bending forces, and ensure that the hinge 90 bends at the groove. A spine 94 arranged transverse to the longitudinal direction is formed in the hinge 90 adjacent to the groove 92 to reinforce the hinge and help concentrate bending forces in the groove.

The sealing means 60 in the cap according to the present invention is formed as a one-piece structure having no moving parts, which simplifies and makes less expensive the manufacture, and provides a reliable and trouble-free unit. The sealing means 60 includes an inwardly directed circumferential ridge 62 formed on an inner surface of the side wall 54. An annular projection 64 is formed in the cap top wall 52 and spaced from the side wall 54. The side wall 54 between the ridge 62 and the top wall 52 and the annular projection 64 form an annular channel 66. The annular channel 66 is formed around the inner circumference of the cap 50 and is shaped to receive the rim 24 at the upper end of the side wall 16 of the body 10. The rim 24 fits snugly into the annular channel 66 to seal the cap 50 and the body 10. As illustrated in FIG. 2, an edge of the side wall 54 of the cap 50 contacts the flange 26 of the body 10 to provide secondary seal.

The seal means 60 is air and water tight, thus providing excellent protection for a chip contained in the container 5 of the present invention. The protective environment of the closed and sealed container protects a ship within from particulate or other contamination and is advantageous for storage and shipping of chips sensitive to damage from contamination, for example, the Pentium®, and similar chips The container 5 may also include destructible means for securing the cap 50 to the body 10 to determine if tampering of the container occurs. The subject matter of U.S. Pat. No. 5,133,470 to Abrams et al. is incorporated herein by reference. Referring to FIG. 1, the body 10 and the cap 50 include tabs 30 and 56, respectively, extending from an exterior of the side walls. The tabs 30, 56 provide a hold for opening the container 5. A breakable member 32 is formed on the body tab 30 and a securing member 58 in the form of a hollow cylinder is formed on the cap tab 56. The breakable member is inserted into the slot 59 in the securing member 58 when the cap is seated in the closed position. Of course, the breakable member may be formed on the cap tab 56, and the securing member correspondingly formed on the body tab 30.

FIG. 7 is a side view of the breakable member 32. The breakable member 32 includes an arrow shaped head 34 and an elongated shaft 36. The shaft 36 includes a narrowed portion 38 where it connects to the body tab 30. The head 34 inserts in the slot 59 deflecting slightly to pass into the cylinder interior. A cross piece 40 acts as a stop. The head 34 cannot be removed from the cylinder without breaking the narrowed portion 38 of the shaft 36.

Alternatively, the securing member may comprise a boss formed on the cap tab 56 with a slot. The thickness of the boss would correspond to the free length of the shaft 36 between the head 34 and the cross piece 40 to provide a snug fit.

The destructible securing means described is illustrative. Other suitable destructible securing means are possible, for example, as described in U.S. Pat. No. 5,133,470 to Abrams et al.

As shown in FIG. 2 and FIG. 5, the top 52 of the cap 50 is formed with an annular projection 53 located near the periphery of the top. The portion of the top 52 radially outside of the annular projection 53 forms a shoulder 55. Referring again to FIG. 2, the wall 14 of the body 10 is formed to extend beyond the bed 16 to provide a free edge 15. The shoulder 55 on the top 52 of the cap provides a supporting location for the free edge 15 of the body 10, thus permitting the vertical stacking of containers 5 according to the invention.

The foregoing has described the preferred principles, embodiments and modes of operation of the present invention; however, the invention should not be construed as limited to the particular embodiments discussed. Instead, the above-described embodiments should be regarded as illustrative rather than restrictive, and it should be appreciated that variations, changes and equivalents may be made by others without departing from the scope of the present invention as defined by the following claims.

What is claimed is:

1. A container for at least one wafer chip, comprising:

a body having a bed and a side wall, the bed having a plurality of upright posts formed in the bed to define a chip containing area and at least one V-shaped portion formed in the bed, the V-shaped portion sloping upward in two directions from a center of the containing area at least to the upright posts;

a cap having a top wall and a side wall, the cap having a plurality of fingers formed on the interior side of the top wall for maintaining a vertical position of the at least one wafer chip in the container, wherein, a chip contained in the container is supported horizontally by a portion of the V-shaped bed adjacent to the upright posts and is constrained from horizontal movement by the upright posts and from vertical movement by the fingers.

2. A container for at least one wafer chip, comprising:

a body having a bed and a side wall defining an interior space, a plurality of upright posts formed in the bed in the interior space and defining a perimeter of at least one containing area, the upright posts maintaining a lateral position of a wafer chip in the container, the bed being V-shaped at least within each containing area so that portions of the bed along the perimeter and on two opposite sides of each containing area provide supporting surfaces for the chip;

a cap having a top wall and a side wall, the cap having a plurality of fingers formed on the interior side of the top wall for maintaining a vertical position of the at least one wafer chip in the container; and, means for sealing the cap to the body when the cap is in the closed position.

3. The container as claimed in claim 2, further comprising depressions formed in the bed along the perimeter on the two supporting surfaces.

4. The container as claimed in claim 2, further comprising a plurality of reinforcing ribs formed on an exterior side of the bed of the body.

5. The container as claimed in claim 2, wherein the fingers are formed with a curvature to provide flexibility in a direction perpendicular to the top wall of the cap.

6. The container as claimed in claim 5, wherein the fingers extend from the top wall of the cap so that in a closed position a convex side of each finger is oriented to contact a wafer chip in the container.

7. The container as claimed in claim 2, wherein the means for sealing comprises an annular projection formed on an interior side of the top wall and spaced from the side wall to form an annular channel for receiving an end of the body side wall.

8. The container as claimed in claim 7, wherein the end of the body side wall is shaped with a radially outwardly extending rim and wherein the side wall of the cap is shaped with a radially inwardly directed circumferential ridge spaced from the top wall, the portion of the side wall between the rim and the top wall and the annular projection forming the annular channel.

9. The container as claimed in claim 7, wherein the sealing means further comprises a flange extending outwardly from the side wall of the body and a flange extending outwardly from the cap, the body flange and the cap flange contacting when the cap is in the closed position.

10. The container as claimed in claim 2, wherein upper ends of the posts and an upper end of the side wall of the body extend to and terminate in a common plane.

11. The container as claimed in claim 2, further comprising a hinge connecting the body with the cap, the hinge being bendable so that the cap is movable from a closed position seated on the body to an open position not seated on the body.

12. The container as claimed in claim 11, wherein the hinge is formed of a flexible material.

13. The container as claimed in claim 12, wherein the hinge further comprises a groove extending in a direction transverse to a longitudinal direction of the hinge, the groove providing a weakened zone for concentrating bending of the hinge.

14. The container as claimed in claim 13, wherein the hinge further comprises a spine adjacent to the groove and extending in a direction transverse to a longitudinal direction of the hinge.

15. The container as claimed in claim 11, wherein the hinge further comprises a spine extending in a direction transverse to a longitudinal direction of the hinge.

16. The container as claimed in claim 2, further comprising a destructible member integrally attached to one of the cap and the body and attachable to the other of the cap and body when the cap is in a closed position, wherein the cap can be opened only upon destruction of the destructible member.

17. The container as claimed in claim 15, wherein the destructible member comprises a member having an arrow-shaped head and an elongated shaft portion, the arrow-shaped head mating with a slot in a securing member.

18. The container as claimed in claim 2, wherein the bed is formed to have a plurality of V-shaped portions, and a plurality of posts are formed to define individual chip containing areas corresponding to each of the V-shaped portions.

* * * * *